(12) United States Patent
Sasaki

(10) Patent No.: US 6,402,981 B1
(45) Date of Patent: Jun. 11, 2002

(54) COMPOSITION OF PIEZOELECTRIC PORCELAIN

(75) Inventor: Satoshi Sasaki, Tokyo (JP)

(73) Assignee: TDK Corporation, Tokyo (JP)

(*) Notice: Subject to any disclaimer, the term of this patent is extended or adjusted under 35 U.S.C. 154(b) by 21 days.

(21) Appl. No.: 09/665,589

(22) Filed: Sep. 19, 2000

(30) Foreign Application Priority Data

Sep. 20, 1999 (JP) .............................. 11-264741

(51) Int. Cl.$^7$ ...................... C04B 35/49; H01L 41/187
(52) U.S. Cl. ...................... 252/62.9 PZ; 501/134; 501/135
(58) Field of Search ............. 252/62.9 PZ; 501/134, 501/135

(56) References Cited

U.S. PATENT DOCUMENTS 4,087,366 A * 5/1978 Tanaka et al. ....... 252/62.9 PZ
4,184,971 A * 1/1980 Tanaka et al. ....... 252/62.9 PZ
6,051,157 A * 4/2000 Sasaki et al. ........ 252/62.9 PZ

FOREIGN PATENT DOCUMENTS

| JP | 50-156700 | 12/1975 |
| JP | 54-26716 | 9/1979 |
| JP | 54-26717 | 9/1979 |
| JP | 4-224168 | 8/1992 |
| JP | 5-139829 | 6/1993 |

* cited by examiner

Primary Examiner—C. Melissa Koslow
(74) Attorney, Agent, or Firm—Oblon, Spivak, McClelland, Maier & Neustadt, P.C.

(57) ABSTRACT

There is provided a composition of piezoelectric porcelain which is composed as $x(Pb_2Sb_2O_7)_{1/2} \cdot (1-x)[Pb_a(Zr_yTi_z)O_3]$ (provided that $0.98 \leq a \leq 0.999$, $0.005 \leq x \leq 0.05$, $0.50 \leq y \leq 0.54$, $0.46 \leq z \leq 0.50$, $y+z=1$) is a main component, and to the weight of 1 mol of the main component, 0.1 to 1.0 wt % of at least one kind of W, Sb, Nb, and Ta in terms of $WO_3$, $Sb_2O_3$, $Nb_2O_5$, and $Ta_2O_5$ is added as a sub component, and 0.01 to 0.1 wt % of Si in terms of $SiO_2$ is added as a further sub component.

2 Claims, 3 Drawing Sheets

No.(1): $0.025(Pb_2Sb_2O_7)_{1/2} \cdot 0.975[Pb_a(Zr_{0.52}Ti_{0.48})O_3]+Nb_2O_5$ 0.5wt%+$SiO_2$ 0.05wt%
No.(2): $0.025(Sr_2Sb_2O_7)_{1/2} \cdot 0.975[Pb_a(Zr_{0.52}Ti_{0.48})O_3]+Nb_2O_5$ 0.5wt%+$SiO_2$ 0.05wt%

COMPOSITION OF PIEZOELECTRIC PORCELAIN

BACKGROUND OF THE INVENTION

1. Field of the Invention

The invention relates to composition of piezoelectric porcelain for ceramic piezoelectric sensor to be used for detecting vibration, and in particular to the composition of piezoelectric porcelain suited for detecting vibration of automobile engines.

2. Description of the Related Art

When the composition of piezoelectric porcelain is used to the piezoelectric ceramic sensor to be used for detecting vibration, it is required to have as characteristics high electromechanical coupling factor kt of longitudinal vibration in thickness (for example, 50% or higher) and large specific dielectric constant (for example, 1000 or more).

For stabilizing sensitivity of the sensor to changes of environmental temperature, it is preferable that change of the piezoelectric characteristics such as electromechanical coupling factor, capacitance and others is small irrespectively of changes in the temperature (for example, in a case of the electromechanical coupling factor, the electromechanical coupling factor is −100 ppm/° C. to 100 ppm/° C. when the temperature is changed in the range between −40° C. to 85° C.).

Further, depending on usage, the sensor itself is often effected with pressure, otherwise since engines and the neighborhood thereabout are necessarily actuated under large vibration, strength is demanded to be high as possible.

Composition of lead titanate zirconate base has conventionally been known as suited for the composition of piezoelectric porcelain to be used to ceramic oscillators or ceramic filters, and it has been variously improved in response to usage.

There are known, for example, a material where oxides of Nb, Sb, W, Mn and the like are added to the composition of lead titanate zirconate base to improve porcelain properties, another material where composite perovskite compound such as $Pb(Nb_{1/2}Sb_{1/2})O_3$ and $Pb(Mg_{1/3}Nb_{2/3})O_3$ as a third component is made solid solution in the composition of lead titanate zirconate base to improve the porcelain properties- and further oxides of Nb, Sb, W, Mn are added, or a further material where a part of Pb of these above compositions is substituted with Ba, Sr or Ca for improving the temperature characteristics of resonance frequency.

Applicant previously proposed that pyrochlore typed composite oxide of $Pb_2Sb_2O_7$, $Ba_2Sb_2O_7$ or others is made solid solution as a third component in a base porcelain composition of lead titanate zirconate, thereby enabling to obtain large electromechanical coupling factor kp and specific dielectric constant ∈, and small change of capacitance owing to changes in the temperature (JP-B-54-26716 and JP-B-54-26717).

Further, the applicant previously proposed that the pyrochlore typed composite oxide of $Ba_2Sb_2O_7$ is made solid solution as a third component in the base porcelain composition of lead titanate zirconate, to which $Nb_2O_5$ is added as a sub component, thereby enabling to obtain large electromechanical coupling factor kt and specific dielectric constant ∈, and small temperature characteristic of electromechanical coupling factor kt (JP-A-50-156700).

Since the conventionally known composition of the piezoelectric porcelain aimed at merely making the specific dielectric constant and the electromechanical coupling factor large as the piezoelectric ceramics to be used to actuators, even if the longitudinal electromechanical coupling factor kt in thickness and specific dielectric constant ∈ were large, there was a problem in that change of the piezoelectric characteristics was large corresponding to change of temperature.

JP-B-54-26716 and JP-B-54-26717 propose an addition of $MnO_2$ as a technique for increasing a mechanical strength, but a problem is that this technique makes the mechanical quality factor Qm large, and a product cannot be applied to this kind of sensors.

In addition, JP-A-50-156700 shows the good piezoelectric characteristics and temperature characteristic for a piezoelectric sensor, but a problem exists in the mechanical strength, and a product cannot be employed to the piezoelectric sensors to be used under large vibration.

SUMMARY OF THE INVENTION

Accordingly, it is an object to provide such composition of piezoelectric porcelain having the large specific dielectric constant and electromechanical coupling factor, and the small change of the piezoelectric characteristic owing to changes in the temperature and mechanical quality factor Qm, and the large strength.

As means for solving these problems, the invention is to disclose the following structures.

(1): A composition of piezoelectric porcelain is composed as $x(Pb_2Sb_2O_7)_{1/2} \cdot (1-x)[Pb_a(Zr_yTi_z)O_3]$ (provided that $0.98 \leq a \leq 0.999$, $0.005 \leq x \leq 0.05$, $0.50 \leq y \leq 0.54$, $0.46 \leq z \leq 0.50$, y+z=1) is a main component, and to the weight of 1 mol of the main component, 0.1 to 1.0 wt % of at least one kind of W, Sb, Nb, and Ta in terms of $WO_3$, $Sb_2O_3$, $Nb_2O_5$, and $Ta_2O_5$ is added as a sub component, and 0.01 to 0.1 wt % of Si in terms of $SiO_2$ is added as a further sub component.

(2): A composition of piezoelectric porcelain is composed as $x(Me_2Sb_2O_7)_{1/2} \cdot (1-x)[Pb_a(Zr_yTi_z)O_3]$ (provided that $0.98 \leq a \leq 0.999$, $0.005 \leq x \leq 0.05$, $0.50 \leq y \leq 0.54$, $0.46 \leq z \leq 0.50$, y+z=1, Me is at least one kind selected from Ba and Sr) is a main component, and to the weight of 1 mol of the main component, 0.1 to 1.0 wt % at least one kind of W, Sb, Nb, and Ta in terms of $WO_3$, $Sb_2O_3$, $Nb_2O_5$, and $Ta_2O_5$ is added as a sub component, and 0.01 to 0.1 wt % of Si in terms of $SiO_2$ is added as a further sub component.

By this structure, it is possible to obtain the composition of piezoelectric porcelain for the piezoelectric sensor having the excellent sensitivity and temperature characteristic and the high reliability in strength of the piezoelectric porcelain.

The pyrochlore typed composite oxide $Pb_2Sn_2O_7$ or $Me_2Sb_2O_7$ (Me is at least one kind selected from Ba and Sr) is made solid solution as the third component in the base porcelain composition of lead titanate zirconate because of improving the characteristics of the piezoelectric porcelain. It is possible thereby to obtain the composition of piezoelectric porcelain suited to the piezoelectric sensor for detecting vibration in the ratio of Ti/Zr in a relatively broad range.

To the weight of 1 mol of the main component, 0.1 to 1.0 wt % of at least one kind of W, Sb, Nb, and Ta in terms of $WO_3$, $Sb_2O_3$, $Nb_2O_5$, and $Ta_2O_5$ is added as a sub component, because of making crystal grain diameter of porcelain fine so as to improve the stability of the piezoelectric porcelain and making change of the piezoelectric characteristic owing to changes in the temperature small. It is possible thereby to obtain the piezoelectric porcelain for the piezoelectric sensor having small change of the characteristics by temperature.

0.01 to 0.1 wt % of Si in terms of $SiO_2$ is added as a further sub component to the weight of 1 mol of the main component, thereby enabling to make binding power large and heightening the strength of the piezoelectric porcelain large without deteriorating the characteristics of the piezoelectric porcelain.

If the ratio of the composition of Pb is rendered to be 0.98 to 0.999, the strength of an element may be more heightened.

DETAILED DESCRIPTION OF THE PREFERRED EMBODIMENTS

Figure 1:
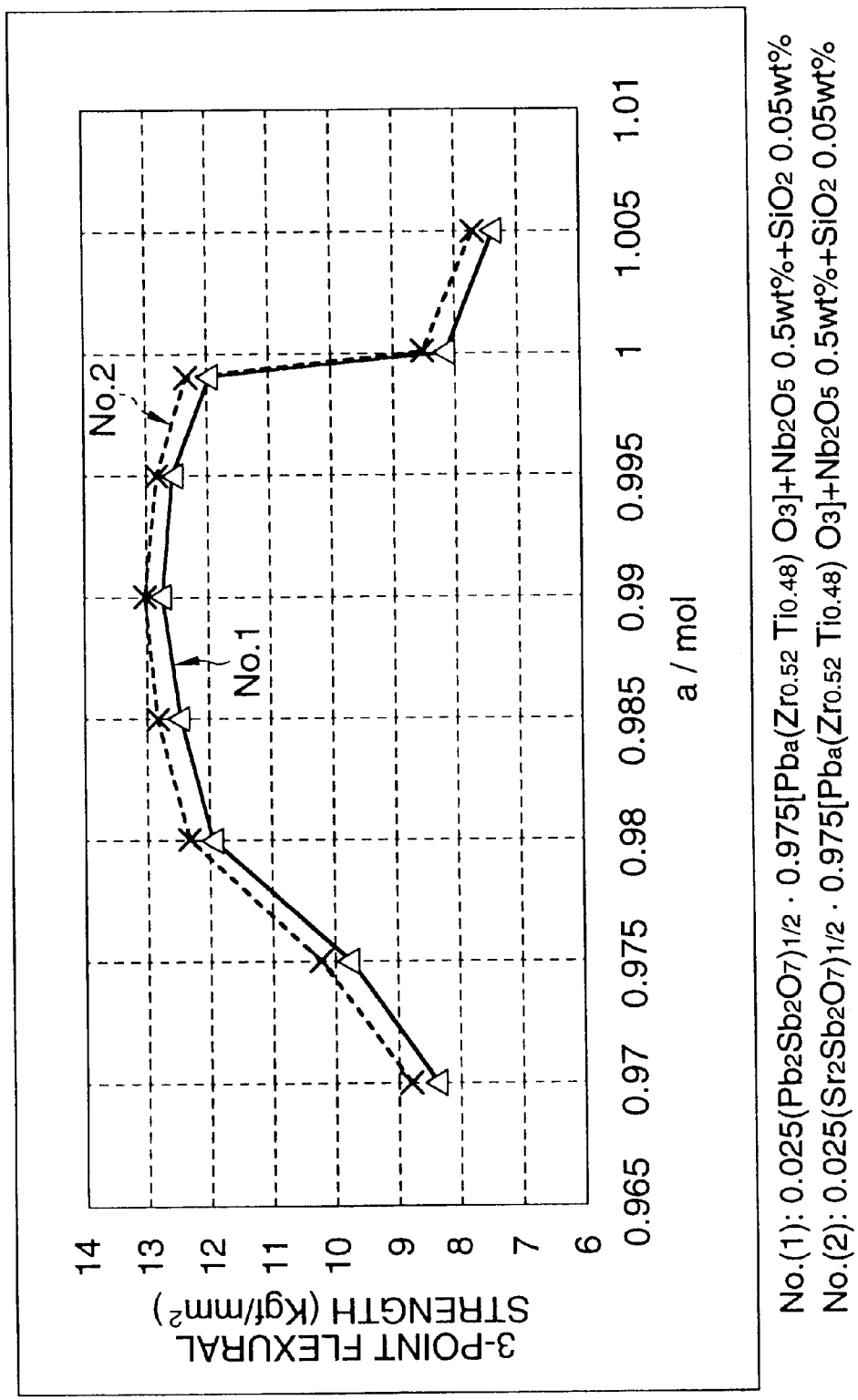
FIG. 1 shows the results of the 3-point flexural strength test when the values of a are changed.

Hereinafter, examples of the invention are described.

Chemically pure PbO, $TiO_2$, $ZrO_2$, $Sb_2O_5$, $Nb_2O_5$, $Ta_2O_5$, $WO_3$, $BaCO_3$, and $SrCO_3$ were used as starting raw materials, weighed to be compositions shown in Tables 1 and 2, and wet-mixed by a ball mill. Next, the mixed particles were temporarily baked at 850° C. to 950° C. in an air, and then wet-pulverized by the ball mill.

Subsequently, the thus obtained powder was added with an organic binder and granulated so as to form disc-like shape of 15 mm in diameter and 1.5 mm in thickness under pressure of 2000 kg/cm². The formed product was baked at temperature of 1100° C. to 1240° C. in the air atmosphere.

The thus obtained sintered product was ground on surface until 1.0 mm in thickness and processed to 10 mm in diameter. Then, after silver-baked electrodes were formed, the sintered product is carried out with a polarization process in thickness direction in an insulating oil of 80° C. to 120° C. under a condition of supplying voltage of 2 kV/mm to 3 kV/mm for 30 minutes so as to obtain elements for evaluation.

The evaluating elements were measured as to element capacitance (C), resonance frequency (fr), and anti-resonance frequency (fa) by means of an impedance analyzer. Based on the measured results, the specific dielectric constant (∈), the electromechanical coupling factor (kt) of longitudinal vibration in thickness, and the mechanical quality factor (Qm) were obtained by calculation.

With respect to change of the piezoelectric characteristic owing to changes in the temperature, the elements were laid in a testing chamber under a constant temperature for measuring the change of the electromechanical coupling factor kt owing to changes in the temperature at −40° C. to 85° C., and on the basis of 20° C., the temperature coefficient of the electromechanical coupling factor kt at −40° C. to 85° C. was calculated.

The strength of the piezoelectric porcelain was measured by a 3-point flexural method, using a precision load measuring apparatus, and calculated.

Results available by the above methods are shown in Tables 1 and 2. * marks in Tables 1 and 2 indicate Comparative examples out of the range of the invention.

TABLE 1

| Sample No. | Composition | | | | | | Electromechanical coupling factor (kt) | Specific dielectric constant (∈) | Mechanical quality factor (Qm) | kt Temperature coefficient (kt · TC) |
|---|---|---|---|---|---|---|---|---|---|---|
| | a mol | x mol | y mol | z mol | Sub component 1 Kinds | $SiO_2$ wt % | % | — | — | ppm/° C. |
| | | | | | | wt % | | | | |
| *1 | 0.97 | 0.025 | 0.52 | 0.48 | $WO_3$ 0.5 | 0.05 | 40.7 | 750 | 120 | −70 |
| 2 | 0.98 | 0.025 | 0.52 | 0.48 | $WO_3$ 0.5 | 0.05 | 50.0 | 1080 | 100 | −60 |
| 3 | 0.999 | 0.025 | 0.52 | 0.48 | $WO_3$ 0.5 | 0.05 | 53.5 | 1860 | 90 | −60 |
| *4 | 1 | 0.025 | 0.52 | 0.48 | $WO_3$ 0.5 | 0.05 | 54.2 | 2010 | 80 | −40 |
| *5 | 0.99 | 0 | 0.51 | 0.49 | $WO_3$ 0.5 | 0.05 | 46.4 | 930 | 350 | −250 |
| 6 | 0.99 | 0.005 | 0.51 | 0.49 | $WO_3$ 0.5 | 0.05 | 51.3 | 1220 | 100 | −30 |
| 7 | 0.99 | 0.05 | 0.52 | 0.48 | $WO_3$ 0.5 | 0.05 | 56.8 | 1870 | 80 | 100 |
| *8 | 0.99 | 0.06 | 0.52 | 0.48 | $WO_3$ 0.5 | 0.05 | 55.5 | 1940 | 80 | 550 |
| *9 | 0.99 | 0.025 | 0.52 | 0.48 | $WO_3$ 0 | 0.05 | 50.0 | 1480 | 90 | −210 |
| 10 | 0.99 | 0.025 | 0.52 | 0.48 | $WO_3$ 0.1 | 0.05 | 51.2 | 1520 | 90 | −70 |
| 11 | 0.99 | 0.025 | 0.52 | 0.48 | $WO_3$ 1.0 | 0.05 | 50.6 | 1510 | 90 | 90 |
| *12 | 0.99 | 0.025 | 0.52 | 0.48 | $WO_3$ 1.3 | 0.05 | 41.8 | 1270 | 100 | 460 |
| 13 | 0.99 | 0.025 | 0.52 | 0.48 | $WO_3$ 0.5 | 0.1 | 53.3 | 1570 | 90 | −80 |
| *14 | 0.99 | 0.025 | 0.52 | 0.48 | $WO_3$ 0.5 | 0.13 | 42.9 | 1330 | 100 | −150 |
| 15 | 0.99 | 0.025 | 0.52 | 0.48 | $Nb_2O_5$ 0.5 | 0.05 | 54.3 | 1610 | 90 | −40 |
| 16 | 0.99 | 0.025 | 0.52 | 0.48 | $Sb_2O_3$ 0.5 | 0.05 | 55.7 | 1630 | 90 | −60 |
| 17 | 0.99 | 0.025 | 0.52 | 0.48 | $Ta_2O_5$ 0.5 | 0.05 | 54.4 | 1620 | 90 | −50 |
| 18 | 0.99 | 0.025 | 0.52 | 0.48 | $Nb_2O_5$ 0.3 $Sb_2O_3$ 0.2 | 0.05 | 54.8 | 1650 | 90 | −50 |
| 19 | 0.99 | 0.025 | 0.52 | 0.48 | $Ta_2O_5$ 0.3 $Nb_2O_5$ 0.2 | 0.05 | 54.6 | 1640 | 90 | −50 |

TABLE 1-continued

| Sample No. | Composition | | | | | | SiO$_2$ wt % | Electro-mechanical coupling factor (kt) % | Specific dielectric constant ($\epsilon$) | Mechanical quality factor (Qm) | kt Temperature coefficient (kt · TC) ppm/° C. |
|---|---|---|---|---|---|---|---|---|---|---|---|
| | a mol | x mol | y mol | z mol | Sub component 1 Kinds | wt % | | | | | |
| 20 | 0.99 | 0.025 | 0.52 | 0.48 | WO$_3$<br>Ta$_2$O$_5$ | 0.3<br>0.2 | 0.05 | 55.3 | 1690 | 90 | −60 |
| 21 | 0.99 | 0.025 | 0.52 | 0.48 | Sb$_2$O$_3$<br>Nb$_2$O$_5$<br>Ta$_2$O$_5$ | 0.2<br>0.2<br>0.2 | 0.05 | 54.5 | 1710 | 90 | −70 |
| 22 | 0.99 | 0.025 | 0.52 | 0.48 | Sb$_2$O$_3$<br>Ta$_2$O$_5$<br>Nb$_2$O$_5$<br>WO$_3$ | 0.1<br>0.1<br>0.1<br>0.1 | 0.05 | 55.5 | 1600 | 90 | −30 |
| *23 | 0.99 | 0.05 | 0.55 | 0.45 | WO$_3$ | 0.5 | 0.05 | 50.6 | 1100 | 100 | 300 |
| 24 | 0.99 | 0.05 | 0.54 | 0.46 | WO$_3$ | 0.5 | 0.05 | 51.2 | 1660 | 90 | 100 |
| 25 | 0.99 | 0.01 | 0.50 | 0.50 | WO$_3$ | 0.5 | 0.05 | 51.3 | 1120 | 100 | −40 |
| *26 | 0.99 | 0.01 | 0.49 | 0.51 | WO$_3$ | 0.5 | 0.05 | 48.8 | 970 | 120 | 100 |

*marks indicate the comparative examples out of the range of the invention.

TABLE 2

| Sample No. | Me Kinds | Composition | | | | | | SiO$_2$ wt % | Electro-mechanical coupling factor (kt) % | Specific dielectric constant ($\epsilon$) | Mechanical quality factor (Qm) | kt Temperature coefficient (kt · TC) ppm/° C. |
|---|---|---|---|---|---|---|---|---|---|---|---|---|
| | | a mol | x mol | y mol | z mol | Sub component 1 Kinds | wt % | | | | | |
| *27 | Sr | 0.97 | 0.025 | 0.52 | 0.48 | WO$_3$ | 0.5 | 0.05 | 41.1 | 760 | 120 | −80 |
| 28 | Sr | 0.98 | 0.025 | 0.52 | 0.48 | WO$_3$ | 0.5 | 0.05 | 50.3 | 1080 | 100 | −80 |
| 29 | Sr | 0.999 | 0.025 | 0.52 | 0.48 | WO$_3$ | 0.5 | 0.05 | 53.8 | 1840 | 80 | −70 |
| *30 | Sr | 1 | 0.025 | 0.52 | 0.48 | WO$_3$ | 0.5 | 0.05 | 54.9 | 2030 | 70 | −50 |
| *31 | Sr | 0.99 | 0 | 0.51 | 0.49 | Sb$_2$O$_3$ | 0.5 | 0.05 | 46.3 | 920 | 340 | −240 |
| 32 | Sr | 0.99 | 0.005 | 0.51 | 0.49 | Sb$_2$O$_3$ | 0.5 | 0.05 | 51.5 | 1210 | 100 | −20 |
| 33 | Sr | 0.99 | 0.05 | 0.52 | 0.48 | Sb$_2$O$_3$ | 0.5 | 0.05 | 56.1 | 1880 | 80 | 100 |
| *34 | Sr | 0.99 | 0.06 | 0.52 | 0.48 | Sb$_2$O$_3$ | 0.5 | 0.05 | 57.0 | 1960 | 70 | 580 |
| *35 | Sr | 0.99 | 0.025 | 0.52 | 0.48 | WO$_3$ | 0 | 0.05 | 50.2 | 1490 | 90 | −220 |
| 36 | Sr | 0.99 | 0.025 | 0.52 | 0.48 | WO$_3$ | 0.1 | 0.1 | 51.9 | 1540 | 90 | −70 |
| 37 | Sr | 0.99 | 0.025 | 0.52 | 0.48 | WO$_3$ | 1.0 | 0.05 | 50.8 | 1530 | 90 | 90 |
| *38 | Sr | 0.99 | 0.025 | 0.52 | 0.48 | WO$_3$ | 1.3 | 0.05 | 41.7 | 1270 | 100 | 450 |
| 39 | Sr | 0.99 | 0.025 | 0.52 | 0.48 | WO$_3$ | 0.5 | 0.1 | 53.5 | 1580 | 90 | −90 |
| *40 | Sr | 0.99 | 0.025 | 0.52 | 0.48 | WO$_3$ | 0.5 | 0.13 | 42.8 | 1350 | 90 | −160 |
| 41 | Sr | 0.99 | 0.025 | 0.52 | 0.48 | Nb$_2$O$_5$ | 0.5 | 0.05 | 54.9 | 1630 | 90 | −40 |
| 42 | Sr | 0.99 | 0.025 | 0.52 | 0.48 | Sb$_2$O$_3$ | 0.5 | 0.05 | 56.4 | 1650 | 90 | −50 |
| 43 | Sr | 0.99 | 0.025 | 0.52 | 0.48 | Ta$_2$O$_5$ | 0.5 | 0.05 | 54.8 | 1640 | 90 | −60 |
| 44 | Ba | 0.99 | 0.025 | 0.52 | 0.48 | WO$_3$ | 0.5 | 0.05 | 53.7 | 1600 | 90 | −60 |
| 45 | Ba | 0.99 | 0.025 | 0.52 | 0.48 | Nb$_2$O$_5$ | 0.5 | 0.05 | 54.5 | 1620 | 90 | −50 |
| 46 | Ba | 0.99 | 0.025 | 0.52 | 0.48 | Sb$_2$O$_3$ | 0.5 | 0.05 | 55.9 | 1640 | 90 | −60 |
| 47 | Ba | 0.99 | 0.025 | 0.52 | 0.48 | Ta$_2$O$_5$ | 0.5 | 0.05 | 54.6 | 1630 | 90 | −70 |
| 48 | Sr<br>Ba | 0.99 | 0.01<br>0.01 | 0.52 | 0.48 | WO$_3$ | 0.5 | 0.05 | 53.8 | 1600 | 90 | −60 |
| 49 | Sr<br>Ba | 0.99 | 0.01<br>0.01 | 0.52 | 0.48 | Nb$_2$O$_5$ | 0.5 | 0.05 | 53.2 | 1570 | 90 | −40 |
| 50 | Sr<br>Ba | 0.99 | 0.01<br>0.01 | 0.52 | 0.48 | Sb$_2$O$_3$ | 0.5 | 0.05 | 53.7 | 1600 | 90 | −50 |
| 51 | Sr<br>Ba | 0.99 | 0.01<br>0.01 | 0.52 | 0.48 | Ta$_2$O$_5$ | 0.5 | 0.05 | 53.5 | 1590 | 90 | −70 |
| 52 | Sr | 0.99 | 0.025 | 0.52 | 0.48 | Sb$_2$O$_3$<br>Nb$_2$O$_5$ | 0.3<br>0.2 | 0.05 | 55.1 | 1680 | 90 | −50 |
| 53 | Ba | 0.99 | 0.025 | 0.52 | 0.48 | Sb$_2$O$_3$<br>Nb$_2$O$_5$ | 0.3<br>0.2 | 0.05 | 55.0 | 1660 | 90 | −60 |
| 54 | Ba<br>Sr | 0.99 | 0.01<br>0.01 | 0.52 | 0.48 | Ta$_2$O$_5$<br>Nb$_2$O$_5$ | 0.3<br>0.2 | 0.05 | 53.0 | 1590 | 90 | −60 |
| 55 | Sr | 0.99 | 0.025 | 0.52 | 0.48 | WO$_3$<br>Ta$_2$O$_5$ | 0.3<br>0.2 | 0.05 | 55.5 | 1720 | 80 | −70 |
| 56 | Sr | 0.99 | 0.025 | 0.52 | 0.48 | Sb$_2$O$_3$<br>Nb$_2$O$_5$<br>Ta$_2$O$_5$ | 0.2<br>0.2<br>0.2 | 0.05 | 55.1 | 1750 | 80 | −80 |

TABLE 2-continued

| Sample No. | Composition | | | | | | | Electro-mechanical coupling factor (kt) | Specific dielectric constant (ε) | Mechanical quality factor (Qm) | kt Temperature coefficient (kt · TC) |
| --- | --- | --- | --- | --- | --- | --- | --- | --- | --- | --- | --- |
| | Me Kinds | a mol | x mol | y mol | z mol | Sub component 1 Kinds | | SiO$_2$ wt % | | | |
| | | | | | | | wt % | | % | — | — | ppm/° C. |
| 57 | Sr | 0.99 | 0.025 | 0.52 | 0.48 | Sb$_2$O$_3$ | 0.1 | 0.05 | 55.8 | 1610 | 90 | −50 |
| | | | | | | Nb$_2$O$_5$ | 0.1 | | | | | |
| | | | | | | Ta$_2$O$_5$ | 0.1 | | | | | |
| | | | | | | WO$_3$ | 0.1 | | | | | |
| *58 | Sr | 0.99 | 0.05 | 0.55 | 0.45 | Sb$_2$O$_3$ | 0.5 | 0.05 | 50.8 | 1120 | 100 | 310 |
| 59 | Sr | 0.99 | 0.05 | 0.54 | 0.46 | Sb$_2$O$_3$ | 0.5 | 0.05 | 51.3 | 1690 | 90 | 100 |
| 60 | Sr | 0.99 | 0.01 | 0.50 | 0.50 | Sb$_2$O$_3$ | 0.5 | 0.05 | 51.5 | 1140 | 100 | −50 |
| *61 | Sr | 0.99 | 0.01 | 0.49 | 0.51 | Sb$_2$O$_3$ | 0.5 | 0.05 | 48.9 | 980 | 110 | 110 |

*marks indicate the comparative examples out of the range of the invention.

The compositions of the invention is limited to the followings.

(1) The first composition of piezoelectric porcelain is composed as follows:

x(Pb$_2$Sb$_2$O$_7$)$_{1/2}$ · (1−x)[Pb$_a$(Zr$_y$Ti$_z$)O$_3$] (provided that 0.98≦a≦0.999, 0.005≦x≦0.05, 0.50≦y≦0.54, 0.46≦z≦0.50, y+z=1) is a main component. As a sub component, at least one kind of W, Sb, Nb, and Ta is added. To the weight of 1 mol of the main component, the added amount of W, Sb, Nb, Ta is in the range between 0.1 and 1.0 wt % in terms of WO$_3$, Sb$_2$O$_3$, Nb$_2$O$_5$, and Ta$_2$O$_5$. Further, Si is added as a sub component, and the added amount of Si is in the range between 0.01 and 0.1 wt % in terms of Si$_2$O$_2$ to the weight of 1 mol of the main component.

(2) the second composition of piezoelectric porcelain is composed as follows:

x(Me$_2$Sb$_2$O$_7$)$_{1/2}$ · (1−x)[Pb$_a$(Zr$_y$Ti$_z$)O$_3$] (provided that 0.98≦a≦0. 999, 0.005≦x≦0.05, 0.50≦y≦0.54, 0.46≦z≦0.50, y+z=1, Me is at least one kind selected from Ba and Sr) is a main component. As a sub component, at least one kind of W, Sb, Nb, and Ta is added. To the weight of 1 mol of the main component, the added amount of W, Sb, Nb, Ta is in the range between 0.1 and 1.0 wt % in terms of WO$_3$, Sb$_2$O$_3$, Nb$_2$O$_5$, and Ta$_2$O$_5$. Further, Si is added as a sub component, and the added amount of Si is in the range between 0.01 and 0.1 wt % in terms of Si$_2$O$_2$ to the weight of 1 mol of the main component.

The reasons for limiting to the compositions of the invention as above is described hereinafter.

(1): if x is less than 0.005, since the electromechanical coupling factor (kt) and the specific dielectric constant (∈) are small, and the mechanical quality factor (Qm) is large, such product is not suitable to the usage of the invention (see Samples Nos. 5 and 31). Reversely, if x exceeds 0.05, the absolute value of the temperature coefficient of the electromechanical coupling factor (kt) is large (see Samples Nos. 8 and 34).

(2): if z is less than 0.46 or y exceeds 0.54, since the absolute value of the temperature coefficient of the electromechanical coupling factor (kt) is large, such product is not suitable to the usage of the invention (see Samples Nos. 23 and 58). If z exceeds 0.50 or y is less than 0.50, desired electromechanical coupling factor (kt) and specific dielectric constant (∈) cannot be available (see Samples Nos. 26 and 61).

Figure 2:
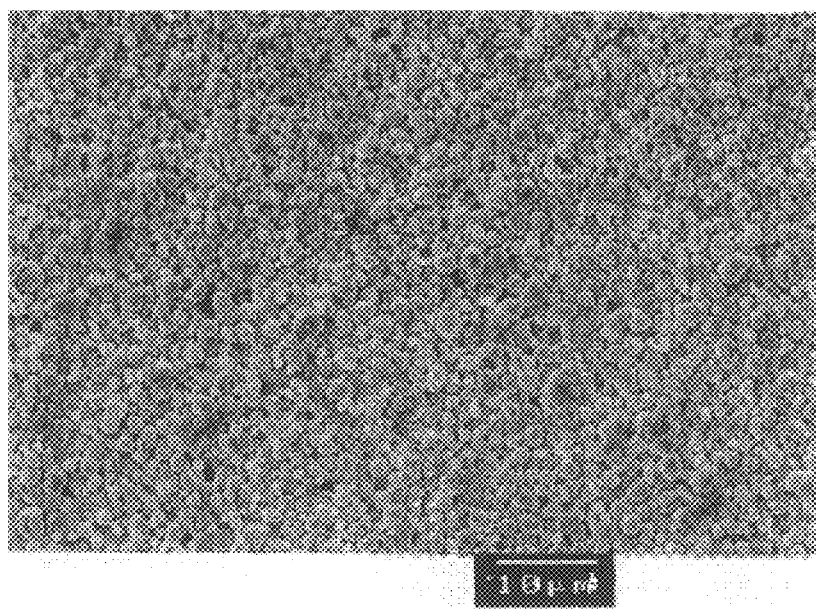
FIG. 2 is an electron microscopic photograph observing particle diameter of the element of Sample No. 15 of the example.

(3): FIG. 2 is an electron microscopic photograph that the ground face of Sample No. 15 as an example of the invention was subjected to an etching treatment, and FIG. 4 is an electron microscopic photograph that the addition amount of the sub component Sb$_2$O$_3$ was made zero (0) in Sample No. 15 so as to produce a sample for comparison, and the comparative sample was measured.

Figure 4:
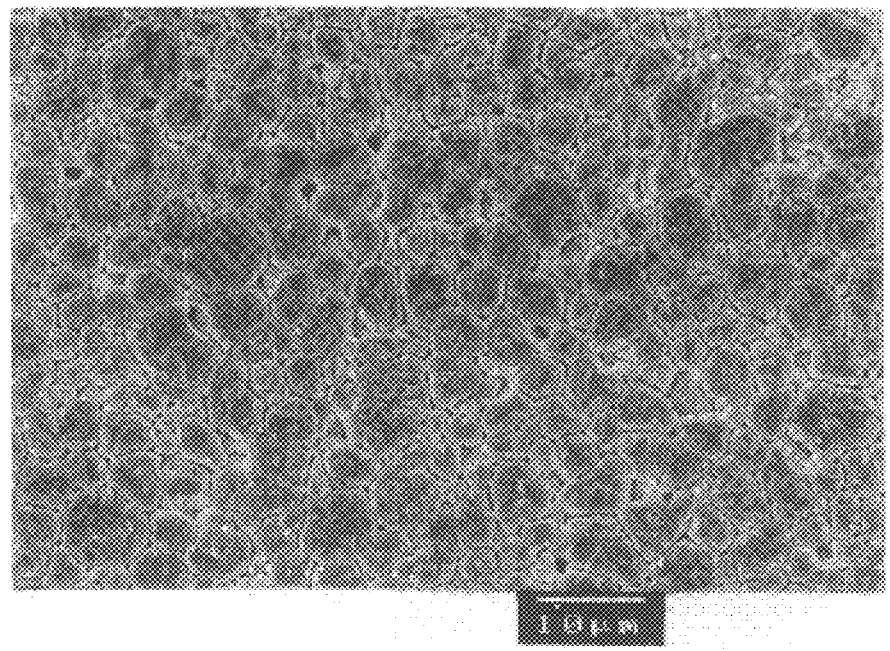
FIG. 4 is an electron microscopic photograph observing particle diameter of the element produced as a comparative example by making zero (0) the addition amount of the sub component $Sb_2O_3$ of Sample No. 15 of the example.

It is seen that in the example of FIG. 2, the particle diameter is smaller than that of the comparative example of FIG. 4, and the particle dimension is more uniform than that of the comparative example of FIG. 4. From this comparison, apparent are effects of fineness and uniformity of particle diameter by the addition of the sub component Sb$_2$O$_3$.

With respect to the contents of the sub components, if the amount of at least one of W, Sb, Nb, and Ta is less than 0.1 wt % in terms of WO$_3$, Sb$_2$O$_3$, Nb$_2$O$_5$, and Ta$_2$O$_5$ to 1 mol of the main component, the above effects cannot be available, and the absolute value of the temperature coefficient of the electromechanical coupling factor (kt) is large (see Samples Nos. 9 and 35). Reversely, if exceeding 1.0 wt %, the absolute value of the temperature coefficient of the electromechanical coupling factor (kt) is also large and the electromechanical coupling factor (kt) is small, and so such product cannot be employed to the usage of the invention (see Samples Nos. 12 and 38).

Figure 3:
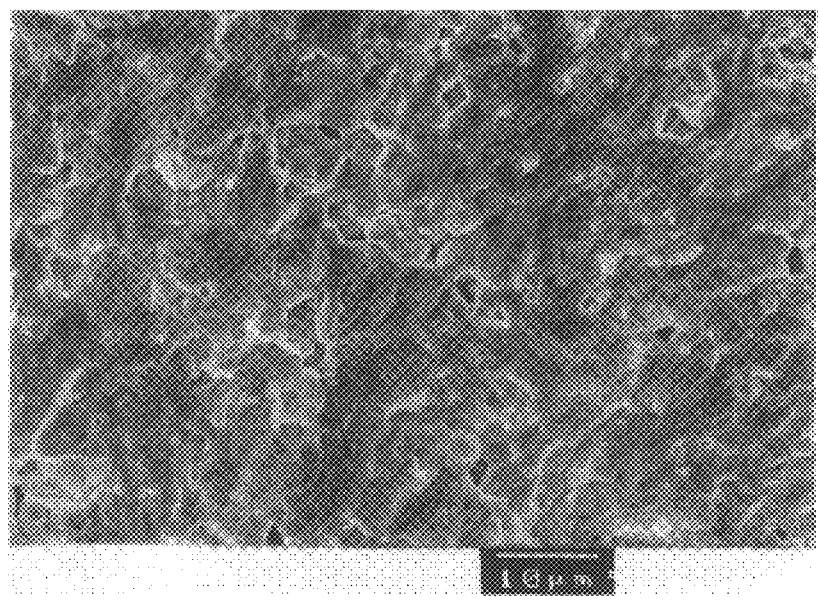
FIG. 3 is an electron microscopic photograph observing fracture of the element of Sample No. 15 of the example.
Figure 5:
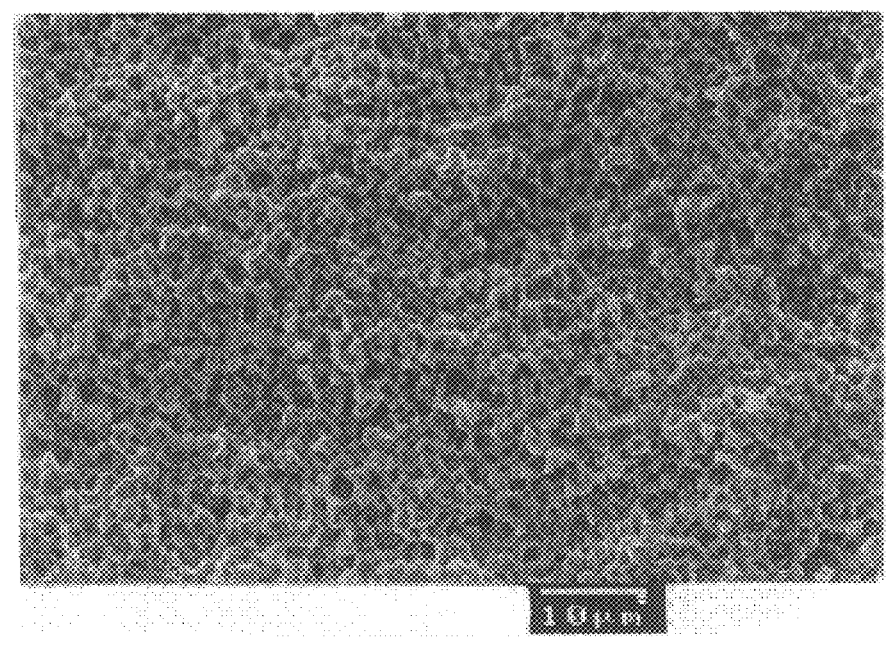
FIG. 5 is an electron microscopic photograph observing fracture of the element produced as the comparative example by making zero (0) the addition amount of $SiO_2$ of Sample No. 15 of the Example.

(4): FIG. 3 is an electron microscopic photograph of fracture of the element of Sample No. 15 as an example of the invention, and FIG. 5 is an electron microscopic photograph that the addition amount of SiO$_2$ of Sample No. 15 was made zero (0) so as to produce fracture in the same manner as the example of the invention.

It is seen that when SiO$_2$ as the sub component of the example of FIG. 3 exists, shadows of particles are scarcely seen in the fracture, and the fracture occurs within the particle. This means that the combining power between particles is strong. In contrast, it is seen that when SiO$_2$ as the sub component of the comparative example of FIG. 5 is not added, the shadows of particles are clear and the fracture occurs in the particle boundary. This means that the combining power between particles is weak. By this comparison, the adding effect of the sub component SiO$_2$ is apparent.

When the addition amount of the sub component SiO$_2$ exceeds 0.1 wt %, the electromechanical coupling factor (kt) is small, and the absolute value of the temperature coefficient of the electromechanical coupling factor is large, and such product cannot be suited to the usage of the invention (see Samples Nos. 14 and 40).

(5): if a is less than 0.98, desired electromechanical coupling factor (kt) and specific dielectric constant (∈) cannot be available (see Samples Nos. 1 and 27).

FIG. 1 shows results of the 3-point flexural strength test when values of a are changed. In FIG. 1, No. (1) and No. (2) are the results of the 3-point flexural strength test when the values of a are changed in the composition of piezoelectric porcelain. The compositions of No. (1) and (2) are as follows:

No. (1): $0.025(Pb_2Sb_2O_7)_{1/2} \cdot 0.975[Pb_a(Zr_{0.52}Ti_{0.48})O_3] + Nb_2O_5$ 0.5 wt % $+SiO_2$ 0.05 wt %, and No. (2): $0.025(Sr_2Sb_2O_7)_{1/2} \cdot 0.975[Pb_a(Zr_{0.52}Ti_{0.48})O_3] + Nb_2O_5$ 0.5 wt % $+SiO_2$ 0.05 wt %.

As apparently from FIG. 1, the 3-point flexural strength is largely lowered when the values of a are outside of the range between 0.98 and 0.999 (see Samples Nos. 4 and 30).

As mentioned above, in the invention, there is provided the composition of piezoelectric porcelain which is composed as $x(Pb_2Sb_2O_7)_{1/2} \cdot (1-x)[Pb_a(Zr_yTi_z)O_3]$ (provided that $0.98 \leq a \leq 0.999$, $0.005 \leq x \leq 0.05$, $0.50 \leq y \leq 0.54$, $0.46 \leq z \leq 0.50$, y+z=1) is a main component, and to the weight of 1 mol of the main component, 0.1 to 1.0 wt % of at least one kind of W, Sb, Nb, and Ta as the sub component is added in terms of $WO_3$, $Sb_2O_3$, $Nb_2O_5$, and $Ta_2O_5$, and 0.01 to 0.1 wt % of Si as a further sub component is added in terms of $SiO_2$. According to the composition of piezoelectric porcelain of the invention, a composition is available that the specific dielectric constant and electromechanical coupling factor are large, and the mechanical quality factor is small, and the change of the piezoelectric characteristic owing to changes in the temperature is small, and the strength is large. Alternatively, the composition of piezoelectric porcelain is composed as $x(Me_2Sb_2O_7)_{1/2} \cdot (1-x)[Pb_a(Zr_yTi_z)O_3]$ (provided that $0.98 \leq a \leq 0.999$, $0.005 \leq x \leq 0.05$, $0.50 \leq y \leq 0.54$, $0.46 \leq z \leq 0.50$, y+z=1, Me is at least one kind selected from Ba and Sr) is a main component, and to the weight of 1 mol of the main component, 0.1 to 1.0 wt % of at least one kind of W, Sb, Nb, and Ta in terms of $WO_3$, $Sb_2O_3$, $Nb_2O_5$, and $Ta_2O_5$ is added as a sub component, and 0.01 to 0.1 wt % of Si in terms of $SiO_2$ is added as a further sub component.

It is possible to compose the composition of piezoelectric porcelain for the piezoelectric sensor having the excellent sensitivity and temperature characteristics of the sensor as well as the high reliability in strength of the piezoelectric porcelain.

What is claimed is:

1. A composition of piezoelectric porcelain comprising:

a main component including $x(Pb_2Sb_2O_7)_{1/2} \cdot (1-x)[Pb_a(Zr_yTi_z)O_3]$, provided that $0.98 \leq a \leq 0.999$, $0.005 \leq x \leq 0.05$, $0.50 \leq y \leq 0.54$, $0.46 \leq z \leq 0.50$, and y+z=1;

0.1 to 1.0 wt % of at least one of W, Sb, Nb, and Ta in terms of $WO_3$, $Sb_2O_3$, $Nb_2O_5$, and $Ta_2O_5$ to the weight of 1 mol of the main component; and 0.01 to 0.1 wt % of Si in terms of $SiO_2$ to the weight of 1 mol of the main component.

2. A composition of piezoelectric porcelain comprising:

a main component including $x(Me_2Sb_2O_7)_{1/2} \cdot (1-x)[Pb_a(Zr_yTi_z)O_3]$, provided that $0.98 \leq a \leq 0.999$, $0.005 \leq x \leq 0.05$, $0.50 \leq y \leq 0.54$, $0.46 \leq z \leq 0.50$, y+z=1, and Me is at least one of Ba and Sr;

0.1 to 1.0 wt % of at least one of W, Sb, Nb, and Ta in terms of $WO_3$, $Sb_2O_3$, $Nb_2O_5$, and $Ta_2O_5$ to the weight of 1 mol of the main component; and 0.01 to 0.1 wt % of Si in terms of $SiO_2$ to the weight of 1 mol of the main component.

* * * * *